(12) United States Patent
Poletto et al.

(10) Patent No.: US 9,595,947 B2
(45) Date of Patent: Mar. 14, 2017

(54) DRIVER DEVICE FOR TRANSISTORS, AND CORRESPONDING INTEGRATED CIRCUIT

(71) Applicant: STMICROELECTRONICS S.r.l., Agrate Brianza (IT)

(72) Inventors: Vanni Poletto, Casale Monferrato (IT); Patrizia Milazzo, S. Agata Li Battiati (IT); Sergio Lecce, Pavia (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 14/797,571

(22) Filed: Jul. 13, 2015

(65) Prior Publication Data
US 2016/0094210 A1    Mar. 31, 2016

(30) Foreign Application Priority Data
Sep. 30, 2014 (IT) .............................. TO2014A0778

(51) Int. Cl.
| H03K 5/04 | (2006.01) |
| H03K 17/041 | (2006.01) |
| H03K 19/003 | (2006.01) |
| H03K 19/0175 | (2006.01) |
| H03K 17/042 | (2006.01) |
| H03K 17/16 | (2006.01) |

(52) U.S. Cl.
CPC ......... *H03K 5/04* (2013.01); *H03K 17/04106* (2013.01); *H03K 17/04206* (2013.01); *H03K 17/166* (2013.01); *H03K 19/00323* (2013.01); *H03K 19/0175* (2013.01)

(58) Field of Classification Search
CPC ...... H03K 3/012; H03K 17/10; H03K 17/102; H03K 17/122; H03K 17/56; H03K 17/60; H03K 17/687; H03K 19/003; H03K 19/00307; H03K 19/00315; H03K 19/00346; H03K 19/00353; H03K 19/00361
USPC ......................... 327/108, 109, 110, 111, 112
See application file for complete search history.

(56) References Cited

U.S. PATENT DOCUMENTS

| 4,860,152 A | 8/1989 | Osborn |
| 5,955,915 A | 9/1999 | Edwards |
| 8,547,142 B2 * | 10/2013 | Nakahara ......... H03K 17/08122 327/108 |
| 2007/0279106 A1 * | 12/2007 | Bennett .............. H03K 17/0822 327/110 |

FOREIGN PATENT DOCUMENTS

| EP | 0 622 717 | 11/1994 |
| EP | 1 052 518 | 11/2000 |
| GB | 2 384 632 | 7/2003 |

* cited by examiner

*Primary Examiner* — John Poos
(74) *Attorney, Agent, or Firm* — Slater Matsil, LLP

(57) ABSTRACT

A driver device is for switching on and off a transistor for supplying a load by driving a control electrode of the transistor. The driver device includes a first terminal connected to the control electrode of the transistor, a second terminal connected between the transistor and the load, and a current-discharge path coupled to the first terminal. The current-discharge path includes a diode and is activated when the transistor is switched off. The diode becomes non-conductive to interrupt the current-discharge path when the voltage on the second terminal reaches a threshold value.

28 Claims, 3 Drawing Sheets

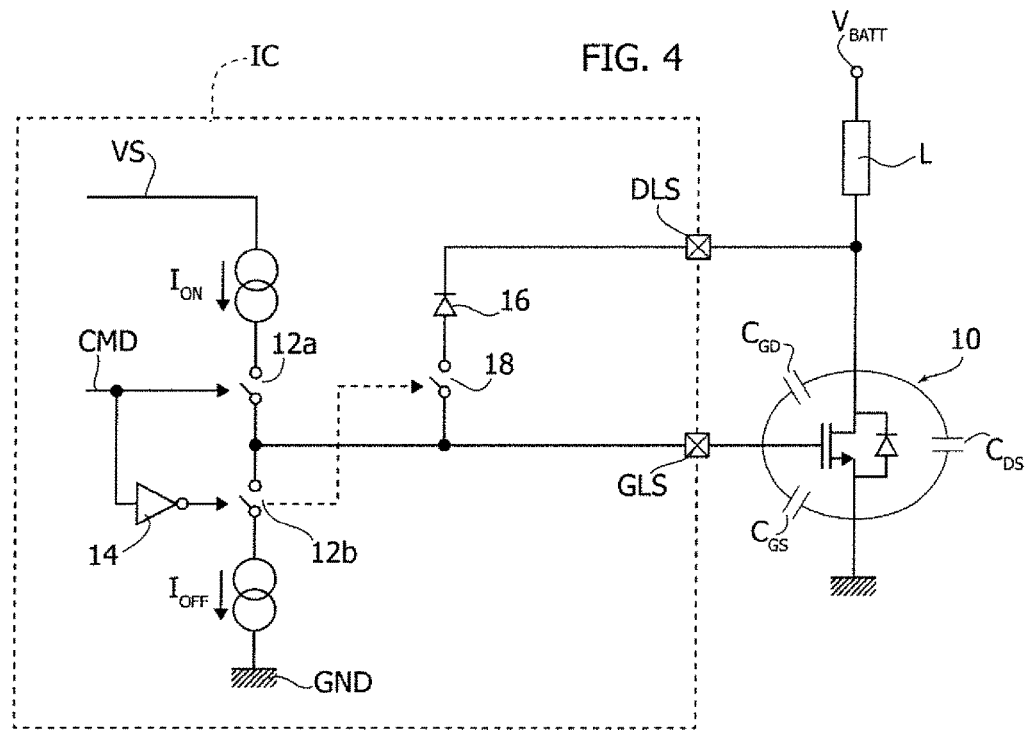
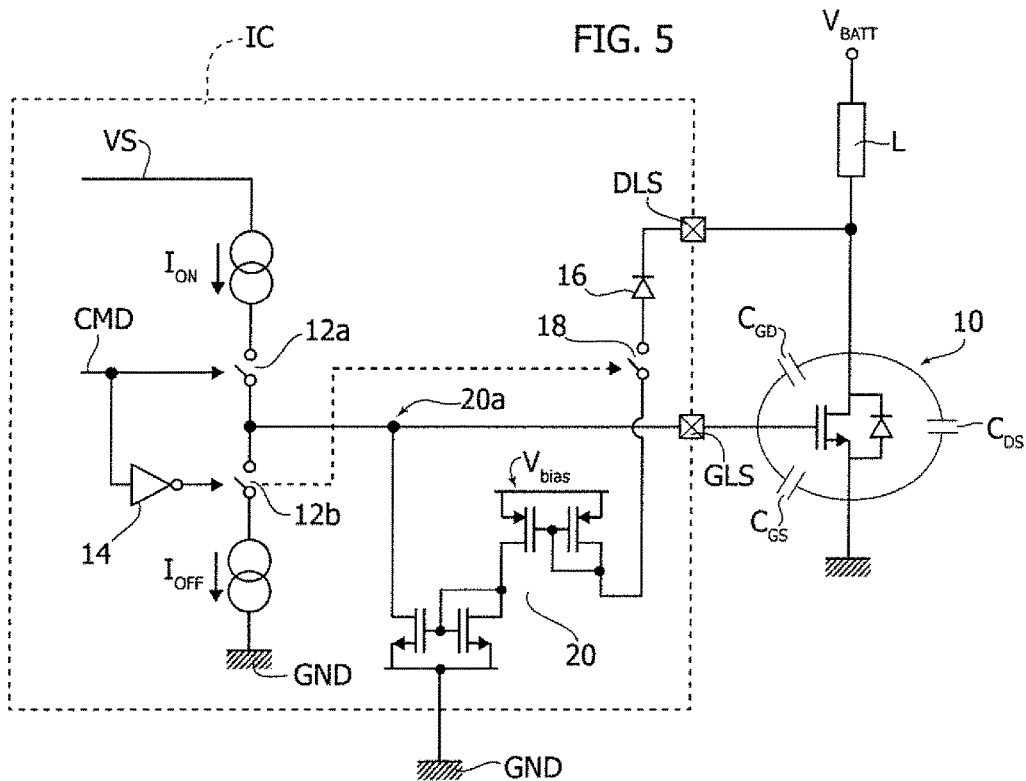

DRIVER DEVICE FOR TRANSISTORS, AND CORRESPONDING INTEGRATED CIRCUIT

FIELD OF THE INVENTION

The disclosure relates to devices for driving transistors. One or more embodiments may be applied to the driving of field-effect transistors (FETs) in the vehicle sector, for example.

BACKGROUND

Various devices may use circuits at an integrated-circuit level for driving transistors, such as one or more FETs, for example. Various applications may drive high-power loads/actuators, for example, where the driver units cannot be completely integrated because of heat dissipation.

Application of such systems may be in the vehicle sector, where systems of the type considered can carry out power-management functions, such as for actuators located in the door zone of a vehicle, for example.

SUMMARY

In the vehicle sector, there is a need to have straightforward and inexpensive approaches capable of providing, for example, a synthesis in terms of slew rate (SR) on the controlled load so as to limit the electromagnetic emissions, and in reducing propagation delay during switching-off so as to have precise timing and prevent cross-current in the external transistors, a phenomenon that may prove dangerous.

One or more embodiments may be directed to a corresponding integrated circuit. The claims form an integral part of the technical teaching provided herein in relation to the disclosed embodiments.

A number of advantages are provided. There is a reduced propagation delay during switching-off ($t_{d\text{-}OFF}$) for a wide range of driving configurations, and to a large extent, irrespective of the characteristics of the external component driven. The slew rate of the output voltage is controlled. There is an efficient use of the silicon area, which leads to cost reductions. Less critical designs may be used, and the devices may be particularly compact.

BRIEF DESCRIPTION OF THE DRAWINGS

One or more embodiments will now be described, purely by way of non-limiting examples, with reference to the annexed figures, wherein:

FIG. 4 is a circuit diagram of one embodiment of a driving scheme of a transistor;

FIG. 5 is a circuit diagram of another embodiment of a driving scheme of a transistor.

DETAILED DESCRIPTION

Figure 1:
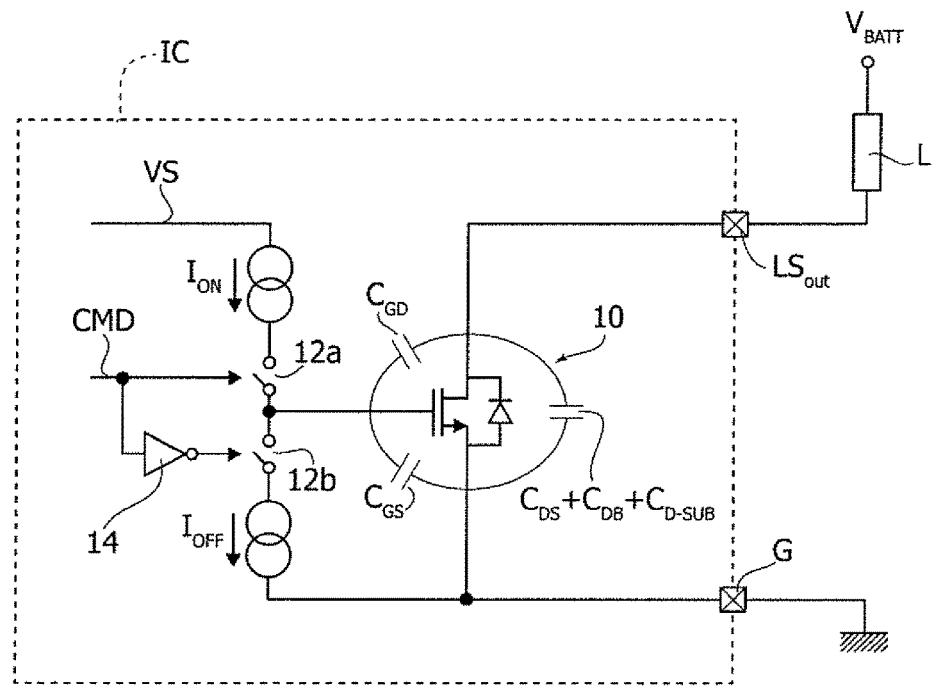
FIG. 1 is a general representation of a low-side driving scheme of a transistor, such as an FET.

Illustrated in the ensuing description are various specific details aimed at providing an in-depth understanding of various examples of the embodiments. The embodiments may be obtained without one or more of the specific details, or with other methods, components, materials, etc. In other cases, known structures, materials, or operations are not illustrated or described in detail so that the various aspects of the embodiments will not be obscured.

Reference to an embodiment or one embodiment in the framework of the present description is intended to indicate that a particular configuration, structure, or characteristic described in relation to the embodiment is included in at least one embodiment. Hence, phrases such as in an embodiment or in one embodiment that may be present in different points of this description do not necessarily refer to the same embodiment. Furthermore, particular conformations, structures, or characteristics may be combined in any adequate way in one or more embodiments.

The references used herein are provided merely for convenience and do not define the sphere of protection or the scope of the embodiments. In various applications, such as in in the vehicle sector, the need may arise for driving loads with high power or high current absorption, such as actuators, for example. The action of driving may be implemented by a basic integrated circuit (chip) of the system, by a driving chip, or even by an altogether integrated chip.

Also using packages with high thermal-dissipation performance, the completely integrated approaches may present limitations in terms of thermal dissipation. There may consequently be the need to use power transistors (e.g., FETs) driven by pre-driving stages set within an integrated form, leaving to the external discrete component the task of reaching the power required for driving the load.

According to the load to be driven, the specific application, and/or the possible requirements in terms of safety, various driving approaches may be used for low-side configurations, high-side configurations, or bridge or half-bridge configurations. This is obtained using, for example, external n-channel power FETs (normally less expensive than p-channel ones given the same ON-resistance), p-channel FETs, or both.

According to the various driving configurations used and/or the various types of power devices used (e.g., re-channel and/or p-channel ones) the need may arise for reaching a compromise in terms of slew rate of the output voltage and propagation delay. For the slew rate of the output voltage it is desired to maintain at a contained value to prevent electromagnetic emissions at an excessive level from arising. For the propagation delay it is desired to reduce so as to control in a precise way the driving times, likewise preventing any cross-current in the case of bridge or half-bridge configurations, for example.

A compromise of this sort, which is more convenient to reach in the case of fully integrated driver devices, may prove more critical when external power devices in the form of discrete components are driven.

For instance, the diagram of FIG. 1 illustrates a power transistor 10 such as, for example, a field-effect transistor (FET) in a low-side configuration, represented with its body-drain diode and the corresponding parasitic capacitances $C_{GS}$ (gate-source capacitance), $C_{GD}$ (gate-drain capacitance), and $C_{DS}+C_{DB}+C_{D\text{-}SUB}$ (drain-source, body-drain, and drain-substrate capacitances). The diagram of FIG. 1 exemplifies the possible use of an n-channel field-effect transistor (n-channel FET) adopting in this regard the representation frequently used in digital applications where an exiting source arrow indicates an n-channel FET, and where an entering source arrow indicates a p-channel FET.

The transistor 10 of the diagram of FIG. 1 is designed to drive a load L (which for simplicity may be assumed to be a resistive type) via a terminal $LS_{out}$ in such a way that the current passing through the current path (i.e., the source-to-drain path) of the transistor 10 passes through the load L, within an integrated circuit IC having a ground-connection terminal G.

The control electrode (gate) of the transistor 10 can be driven with different circuit configurations that, in basic terms, can be obtained due to the action of a command signal CMD that drives two switches (i.e., electronic switches) 12a, 12b.

The switches 12a, 12b (e.g., MOSFETs) can be driven in an alternated way in switching-on (ON) and switching-off (OFF) in such a way that when the switch 12a is ON, i.e., active or closed (namely, conductive), the control terminal of the transistor 10 is connected to a supply voltage VS via a current generator $I_{ON}$, whereas the switch 12b is OFF, i.e., deactivated or open (namely, non-conductive). When the switch 12a is OFF (namely, non-conductive) the switch 12b is ON (namely, conductive) and connects the control electrode of the transistor 10 to the ground connector G via a current generator $I_{OFF}$.

The current generators $I_{ON}$ and $I_{OFF}$ can be implemented by resorting to a wide range of possible known approaches. One approach, for example, is to use current mirrors comprising transistors of any type (MOSS, BJTs, etc.) referred to the power supply VS (generator $I_{ON}$) and to ground (generator $I_{OFF}$).

The function of driving the switches 12a, 12b by the signal CMD has been exemplified herein by the presence of an inverter 14 so as to cause the switch 12a to be driven by the command signal CMD in a direct way. The switch 12b is driven by the command signal CMD inverted by the inverter 14.

By way of reference (and without any limiting intent), the supply voltage VS can be considered as identifying the peak value $V_{GSmax}$ of the voltage that can be applied between the gate and the source of the switch 10.

Again, it may be assumed that the voltage value $V_{OV}$ represents the overdrive value of the power device 10 to give rise to a current in the load with a value $I_{load}$ equal to the ratio between the battery voltage $V_{BATT}$ and the load value $R_{load}$. The load value $R_{load}$ may be resistive and set between the voltage VBAT and the (drain of the) transistor 10.

Figures 2, 3:
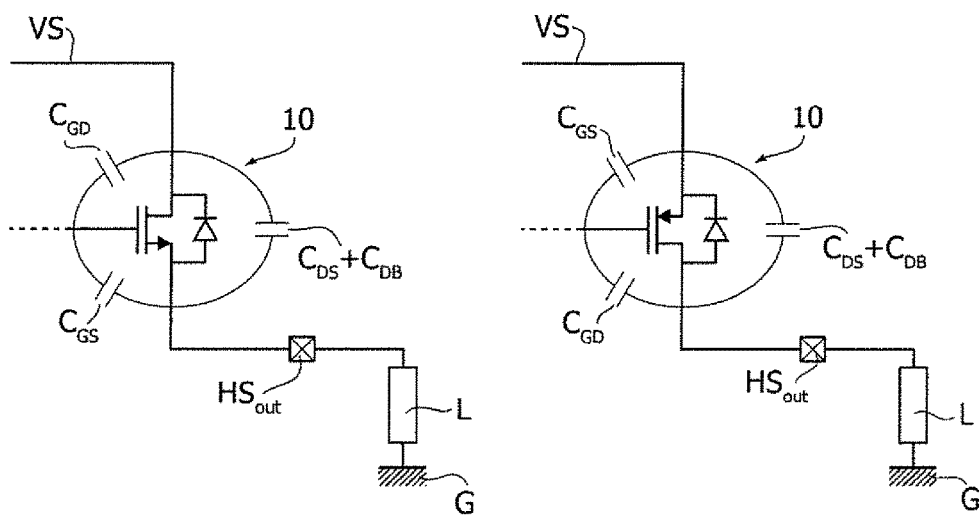
FIGS. 2 and 3 illustrate high-side driving schemes for driving a transistor, such as an FET.

The considerations developed previously with reference to the diagram of FIG. 1, which represents a low-side (LS) driving scheme, can be applied to high-side (HS) driving schemes, as exemplified in FIGS. 2 and 3. The load L is set between an output terminal $HS_{out}$ and ground, so that, also in this case, the current through the load L is identified by the current that flows through the current (source-to-drain) path of the transistor 10.

The diagram of FIG. 3 exemplifies the fact that considerations of the same nature can be extended (independently of the configuration, whether low-side or high-side) to a p-channel FET, like the one represented in FIG. 3. The diagrams of FIGS. 1 and 2 refer to an n-channel FET. It will be appreciated that in the diagrams of FIGS. 2 and 3, regarding the scheme of a high-side driver with FETs 10, an n-channel FET and a p-channel FET, respectively, in the component of parasitic capacitance between source and drain the component regarding the substrate $C_{D-SUB}$ does not appear.

The diagrams of FIGS. 1 to 3 correspond to driving schemes that simply use the presence of current generators that, so to speak, charge and discharge the control electrode (the gate, in the case of a FET) so as to switch on/off the power component 10.

As previously noted, during definition of the characteristics of the driver device it is desirable to be able to control the slew rate (SR) of the output so as to limit the electromagnetic emissions.

Power devices, such as the ones exemplified herein, may present a high value of transconductance (low value of the overdrive $V_{OV}$) in the conditions defined as Miller plateau, namely, when the gate-to-source voltage $V_{GS}$ is subject to small variations. The output voltage passes from the value of the battery voltage $V_{BATT}$ to the value given by the product $R_{ON} \cdot I_{load}$, i.e., by the product of the ON-resistance and the current of the load (or vice versa), with an angular coefficient that depends upon the value of gate-drain capacitance $C_{GD}$.

Driving the control electrode of the power device 10 with current generators so as to meet the requirements in terms of slew rate outlined previously may give rise to quite high delay values, which may be dissymmetrical in the two directions of switching-on and switching-off.

In an attempt to overcome the above problem and reach a more reasonable compromise between containment of the slew rate (SR) and propagation delays, it is possible to resort to approaches such as to enable charging/discharging of the control electrode of the power transistor 10 with higher current values only when the device is not in the Miller-plateau region.

In the case of an integrated driver unit, for example, of the type operating in the low-side (LS) configuration, it is possible to think of activating a fast path of switching-on/off (which does not need to be implemented via current generators) when the gate-to-source voltage $V_{GS}$ is far from the Miller-plateau region. For instance, it is possible to replicate the range of the voltage $V_{GS}$ of the power component using devices adapted to the power output device. In this way, it is possible to reduce the times of actuation delay irrespective of the requirements in terms of slew rate of the output voltage.

It is thus possible to charge/discharge the control electrode of the power device when the device is outside the Miller-plateau region by keeping the current lower and well under control during the step of transition of the output voltage.

Purely by way of reference (and hence without any limiting intent), in the case of a power transistor represented by a discrete FET, a possible value of the gate-to-source peak voltage ($V_{GSmax}$) is approximately 15 V with a threshold voltage $V_{TH}$ of approximately 3 V. It is thus possible to think of activating fast paths of switching-on and switching-off when the drain-to-source voltage $V_{DS}$ is lower than a given threshold value.

In this regard, it has been noted that in the case of an integrated pre-driving unit for an external power transistor such as an FET, for example, when a low-side (LS) driving is implemented, it is possible to adopt a pure current-mode operating approach. This allows control of the slew rate of the output voltage with programmable charge/discharge currents so that it is possible to adapt to different values of the capacitances of the external component.

It is likewise possible to think of having switching-off times ($t_{d-OFF}$) longer than the switching-on delays ($t_{d-ON}$) as already mentioned previously. For the above discrete devices, it is possible to have $V_{GSmax}$ much higher than $V_{TH}$. In this case then, it is possible to reduce the switching-off delay, for example, when bridge or half-bridge configurations are used, in so far as the fact of having a switching-off delay ($t_{d-OFF}$) shorter than the switching-on delay ($t_{d-ON}$) prevents the undesirable phenomenon of cross-currents.

On the other hand, the characteristics of the voltage $V_{GS}$ of an external FET cannot be known in a precise way. It is thus possible to reduce the switching-off delay by activating a robust switching-off path when the drain-to-source voltage $V_{DS}$ starts to increase. A comparator sensitive to this voltage may be used, for example.

The output of such a comparator can also be used during the switching-on step in order to reach the value $V_{GSmax}$ (i.e., the nominal resistance $R_{ON}$) rapidly. This reduces dissipation of the external transistor during the activation transition.

The threshold value of the comparator may, however, be critical, given that it must be higher than the peak value of the product $R_{ON} \cdot I_{load}$, but not excessively high so as not to give rise to a fast initial increase in the voltage $V_{DS}$ with a slew rate that is not well controlled. Also, the delay of such a comparator may prove a critical factor, since once again an excessive delay in deactivating the switching-off path may jeopardize the function of control of the output slew rate. Whereas during switching-on this delay may not have any particular importance (the output voltage rises in any case with a reduced and controlled slew rate), and during switching-off it is possible to have a voltage $V_{DS}$ that may rise rapidly thus jeopardizing the function of control of the slew rate if it is not possible to deactivate the switching-off path rapidly.

In a context like the one exemplified herein (and irrespective of whether it is an LS or HS driving, using an re-channel FET or p-channel FET and, at least virtually, also when bipolar transistors are used instead of FETs), there may arise the need to reduce the switching-off time without jeopardizing control of the slew rate. This is an important aspect also in the case of bridge (half-bridge) configurations, where, as already mentioned previously, it is desirable for the switching-off time $t_{d\text{-}OFF}$ to be shorter than the switching-on time $t_{d\text{-}ON}$ so as to prevent cross-currents in the power device.

The above problem can be tackled with the approach recalled previously, i.e., with a comparator acting on the drain-to-source voltage $V_{DS}$ of the power FET 10. This gives rise, however, to an approach that is rather complex and costly, and presents critical aspects in relation to the choice of the threshold and of the speed of the comparator.

Figure 6:
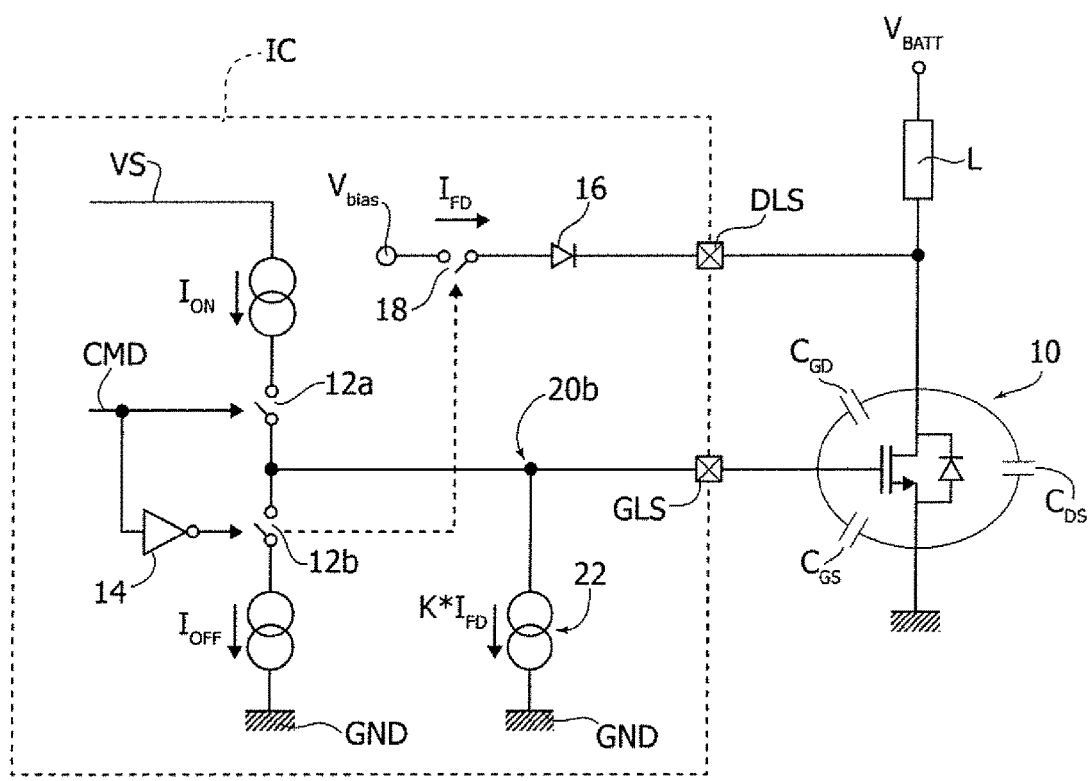
FIG. 6 is a circuit diagram of yet another embodiment of a driving scheme of a transistor.

One or more embodiments may deal with these aspects by providing, as exemplified in the diagrams of FIGS. 4 to 6, a discharge path that is to act between the gate (control electrode) and drain of the FET 10, i.e., the current path through the power transistor 10 and, for example, is located between the power transistor 10 and the load L.

In this regard, it will be appreciated that in FIGS. 4 to 6 parts, elements, or components that are identical or similar to parts, elements, or components that have already been described previously are designated by the same references and will not be described again. It will once more be appreciated that one or more details or particular aspects of the embodiments exemplified with reference to any one of the figures can be freely transposed also to the approaches exemplified in any other figure.

In one or more embodiments, it may be planned that the circuit (which may be built in the form of a driver integrated circuit IC) has a terminal, here designated by DLS, which may be connected to the intermediate point between the load L and the transistor 10. Added to this is the possible presence of another terminal, here designated by GLS, through which the function of driving the control electrode (gate, in the case of an FET) of the power transistor 10 is performed.

The diagrams of the figures exemplify circuit approaches based upon the use of field-effect transistors (FETs) comprising a control terminal or electrode, referred to as a gate, and two further terminals, referred to as a source and a drain, through which the path of flow of the current through the transistor is set up (the gate current is in effect negligible). At least in principle, operating modes substantially similar to the ones exemplified below could be obtained using bipolar transistors. The base of which functions as a control terminal or an electrode with the path of flow of the current through the transistor set up between the other terminals, referred to as an emitter and a collector.

In one or more embodiments, along the discharge path that is to act between the gate and the drain of the power transistor 10, for example, in a position set between the power transistor 10 and the load L, there can be set a diode component 16 (i.e., a component having a diode voltage-current characteristic) cascaded to, i.e., in series with, a switch 18.

The term component with diode voltage-current characteristic is used to mean any component (including a complex component, i.e., a set of a number of interconnected individual components) having a voltage-current characteristic of a rectifier type, i.e. with: a low resistance (virtually equal to zero) in one direction of current conduction, and a high (virtually infinite) resistance in the opposite direction.

Apart from being formed by a diode, such a component may be formed, for example, by any semiconductor component having a junction such as to give rise to the voltage-current characteristic of the type referred to above.

It may, for example, be a bipolar transistor with its base and collector short-circuited with one another. The rectifying characteristic is given by the junction between the base and the emitter, forward biased, with the majority of the current flowing through the collector rather than in the base.

By way of a further non-limiting example, reference may be made to various other more complex (high-voltage) MOS configurations, hence to a set of a number of interconnected individual components, In themselves known, which enable a diode characteristic to be obtained.

In one or more embodiments, the component 16 (referred to for simplicity as a diode component) may be of the type that can withstand a reverse voltage equal to $V_{BATT}$, if the load is resistive. If the load is inductive, it is possible to have a higher recirculation voltage. In one or more embodiments, the component 16 may be of the type that is able to withstand the peak of the voltage $V_{DS}$ of the FET.

In one or more embodiments as exemplified in FIG. 4, the diode component 16 enables provision of a discharge path between the gate and the drain of the power FET 10. There is a possibility of reducing the switching-off delay $t_{d\text{-}OFF}$ with a value of resistance given by the ON-resistance $R_{ON\text{-}FD}$ of the diode itself (plus the resistance $R_{ON}$ of the switch 18).

In one or more embodiments, the discharge path can be activated by causing the switch 18 (which may be formed, for example, by an electronic switch like the switches 12a, 12b) to be coupled to the switch 12b, as exemplified by the dashed line in FIG. 4. This causes the switch 18 to close (i.e., to become conductive) simultaneously with the switch 12b so as to be activated simultaneously with the discharge current that is to control the output slew rate.

The presence of the diode component 16 causes this discharge path to be interrupted (i.e., to disappear) automatically once the output voltage (i.e., the voltage on the point of connection between the load L and the power transistor 10) reaches a threshold value that may be identified by the following:

$(V_{TH}+V_{ov})-V_{BE}$, where:

$V_{TH}$ is the threshold voltage of the FET;

$V_{OV}$ is the overdrive necessary for driving the FET so that, in the saturation region, it will have a drain current equal to $V_{BATT}/R_{LCAD}$; and $V_{BE}$ is the voltage drop across the (diode) rectifier element 16, when it is forward biased.

To a first approximation, for an external FET in the saturation region, the following relation applies:

$$I_D = \beta \cdot (V_{GS}-V_{TH})^2$$

and $V_{OV}$ is defined as follows:

$$V_{OV}=V_{GS}-V_{TH}$$

Hence, for the overdrive referred to above, the following relation applies:

$$V_{BATT}/R_{LOAD}=\beta \cdot (V_{OV})^2$$

All this is obtained without resorting to additional comparators or circuits that might add complexity and impose limitations on the circuit in terms of speed.

As already stated above, the function exemplified herein by the diode component 16 can be implemented either with a diode or with any structure having rectifier characteristics (nominally zero resistance in one direction and infinite resistance in the other) with a forward voltage drop $V_x$ such as to interrupt (i.e., extinguish) automatically the discharge path for a voltage value $(V_{TH}+V_{ov})-V_x$.

It will be appreciated that the principle underlying the approach represented in FIG. 4 with reference to a low-side (LS) driving may be applied indifferently to a high-side (HS) driving.

Likewise, the principle underlying the embodiments exemplified herein is suited to being applied either in the case of p-channel FETs or in the case of n-channel FETs.

In general, it will be appreciated that the connection arrangement (polarity) of the diode component 16 (here exemplified by the cathode facing the terminal DLS) is a function of the direction of the gate-discharge current, and hence may, for example, be with the cathode in the direction of the drain in the case of an n-channel FET and with the anode in the direction of the drain in the case of a p-channel FET.

One or more embodiments thus exemplified in FIG. 4 enable a lower value of the delay $t_{d-OFF}$ to be obtained with a simple, efficient, and non-critical implementation. It may be an implementation that can ensure, for example, an exponential discharge of the parasitic capacitance $C_{GS}+C_{GD}$ through the resistance $R_{ON-FD}$ (in addition to the linear discharge given by the current $I_{OFF}$).

In the case where it is desired to reduce power dissipation during switching-on, it is possible to use a comparator operating on the voltage $V_{DS}$, in conditions substantially less critical than the ones outlined previously.

The diagram of FIG. 5 exemplifies a possible variation embodiment according to one or more embodiments corresponding to the more general diagram exemplified in FIG. 6.

In one or more embodiments as exemplified in FIG. 4, the fast discharge path is implemented between the terminal DLS that is to be connected in an intermediate position between the power transistor 10 and the load L and the line for driving the control electrode (e.g., gate) of the transistor 10, i.e., the terminal GLS.

In one or more embodiments as exemplified in FIG. 5 (and, in more general terms in FIG. 6), the discharge path set along which are the diode component 16 and the switch 18 (which can be driven according to the same modalities as the ones described previously) may in general be connected to a bias voltage ($V_{bias}$) of the circuit IC.

For instance, in one or more embodiments, as exemplified in FIG. 5, the voltage $V_{bias}$ may be the bias voltage (for example, at 3.3V) of a circuit 20 substantially resembling a current mirror that drives (in 20a) the line connected to the GLS terminal (i.e., the line for driving the power transistor 10).

Also in this case, due to the presence of the diode component 16, the discharge path is interrupted (it disappears) once the output voltage reaches a value, for example, the following:

$$3.3V-(V_{BE}+V_{TH-Pch})$$

where:

$V_{BE}$ is the voltage drop across the diode rectifier element 16 when this is forward biased; and $V_{TH-Pch}$ is the threshold voltage of the MOSFET (here a p-channel one) at the input of the current mirror 20.

One or more embodiments may thus be independent of the characteristics of the power transistor 10, thus giving rise to an approach that, in terms of occupation of area of silicon, is more efficient than use, for example, of a comparator, and is also faster and less critical.

Also in this case, the resistance of the discharge path $R_{ON-FD}$ can be used for controlling the speed of initial rise of the voltage $V_{DS}$ as a function of the value $I_{load} \cdot R_{ON}$ up to the deactivation point referred to previously.

The diagram of FIG. 6 highlights the fact that the implementation exemplified in FIG. 5 can be viewed as expressing the more general concept whereby the value of the discharge current $I_{FD}$ that flows through the discharge path—when this is active, i.e., when the diode component 16 is conductive—may be viewed as corresponding to a current value $K \cdot I_{FD}$ so to speak drained in a point 20b by the line for driving the control electrode of the power transistor 10. The gate-discharge current may consequently be viewed as a replica (multiplied in general by a factor K) of the current that flows through the discharge path, once again with this discharge path that is interrupted (i.e., "disappears") once the output voltage, i.e., the voltage between the load L and the power transistor 10, reaches a value that is a function of $V_{bias}$ (for example, equal to $V_{bias}-V_{BE}$), without depending upon the characteristics of the external transistor 10.

In this regard, it will be appreciated, for example, that, in the case of FIG. 4, the switch-off point is $(V_{TH}+V_{ov})-V_{BE}$, where $V_{TH}$ and $V_{ov}$ are characteristics of the external FET. In the cases exemplified in FIGS. 5 and 6, the switch-off point is respectively 3.3 V$-(V_{BE}+V_{TH-Pch})$ and $V_{bias}$, which involve only parameters depending upon the driver circuit (pre-driver).

The adoption of approaches according to one or more embodiments within a circuit, for example, an integrated circuit like the circuit IC may be detected according to the voltage-current characteristic on the driving line (terminal GLS, with reference to the examples of FIGS. 4 to 6) and its correlation with the voltage-current characteristic present, instead, on the terminal connected to the load. In particular, in the switching-off condition, it is possible to detect a possible increase in the gate-discharge current, as the voltage on the drain terminal decreases, with a corresponding increase in the current that can be detected on the drain terminal DLS.

As already recalled previously, the connection arrangement (polarity) of the diode component 16 (here exemplified by the cathode facing the terminal DLS) is a function of the direction of the discharge current and may thus be reversed accordingly (i.e., with the anode facing the terminal DLS) according to the polarity of the components used and their connection.

As already stated, the principle underlying the approach exemplified in FIGS. 4 to 6 with reference to a low-side (LS) driving may be applied indifferently to a high-side (HS) driving. Likewise, the underlying principle exemplified in FIGS. 4 to 6 with a driving according to the embodiments here exemplified is suited to being applied both in the case of p-channel FETs and in the case of n-channel FETs, envisaging a discharge path coupled to the control electrode (gate) of the power transistor, for example with the discharge path between the gate and the drain of the discrete FET 10.

In this regard, it will be appreciated that in the examples set forth in FIGS. 4 to 6, i.e., in the case of low-side (LS) driving with an n-channel, as in the case of high-side (HS) driving with a p-channel, the common terminal between the load and the discrete FET 10 is the drain of the transistor 10 itself. In the case of high-side (HS) driving with an n-channel, as in the case of low-side (LS) driving with a p-channel (with a possible supplementary negative power supply for driving the gate), the common terminal between the load and the discrete FET 10 is the source of the transistor 10 itself.

Of course, without prejudice to the underlying principles, the details of construction and the embodiments may vary, even significantly, with respect to what has been illustrated herein purely by way of non-limiting examples, without thereby departing from the scope of protection. The above scope of protection is defined by the annexed claims.

That which is claimed is:

1. A driver device for switching on and off a transistor feeding a load by driving a control electrode of the transistor, the driver device comprising:
    a first terminal coupled to the control electrode of the transistor;
    a second terminal coupled between the transistor and the load; and
    a current discharge path coupled to said first terminal and being activated when the transistor is switched off, said current discharge path comprising a diode to interrupt said current discharge path based on said second terminal having a voltage reaching a threshold;
    with the transistor comprising a field effect transistor (FET) having a drain, and with said second terminal coupled to the drain of the FET, and with said current discharge path extending between said first and second terminals.

2. The driver device of claim 1, wherein said current discharge path is coupled to a bias voltage, with the threshold being a function of the bias voltage.

3. The driver device of claim 2, further comprising a current generator coupled to the bias voltage, with said current generator being configured to operate on a signal on said first terminal.

4. The driver device of claim 3, wherein said current generator comprises a current mirror.

5. The driver device of claim 1, wherein said current discharge path further comprises an electronic switch in series with said diode.

6. The driver device of claim 5, further comprising a pair of main electronic switches alternatively switchable on and off for switching on and off the transistor, with said electronic switch in said current discharge path being coupled to one of said main electronic switches to be activated synchronously therewith.

7. The driver device of claim 1, wherein said first and second terminals and said current discharge path are configured on an integrated circuit.

8. A driver device for switching on and off a transistor feeding a load coupled thereto, the transistor comprising a control terminal and a first conduction terminal coupled to the load, the driver device comprising:
    a first terminal coupled to the control terminal of the transistor;
    a second terminal coupled between the first conduction terminal of the transistor and the load; and
    a current discharge path coupled to a bias voltage and to said first and second terminals and comprising
        a diode to interrupt said current discharge path based on said second terminal having a voltage reaching a threshold, with the threshold being a function of the bias voltage and
        an electronic switch coupled in series with said diode and configured to activate said current discharge path when the transistor is switched off.

9. The driver device of claim 8, wherein the transistor comprises a field effect transistor (FET), with the control terminal forming a gate and the first conduction terminal forming a drain.

10. The driver device of claim 8, further comprising a current generator coupled to the bias voltage, with said current generator being configured to operate on a signal on said first terminal.

11. The driver device of claim 10, wherein said current generator comprises a current mirror.

12. The driver device of claim 8, further comprising a pair of main electronic switches alternatively switchable on and off for switching on and off the transistor, with said electronic switch in said current discharge path being coupled to one of said main electronic switches to be activated synchronously therewith.

13. The driver device of claim 8, wherein said first and second terminals and said current discharge path are configured on an integrated circuit.

14. A method for making a driver device for switching on and off a transistor feeding a load by driving a control electrode of the transistor, the method comprising:
    coupling a first terminal to the control electrode of the transistor;
    coupling a second terminal between the transistor and the load; and
    coupling a current discharge path to the first terminal and being activated when the transistor is switched off, the current discharge path comprising a diode to interrupt the current discharge path based on the second terminal having a voltage reaching a threshold;
    the transistor comprises a field effect transistor (FET) having a drain and a source, with the second terminal coupled to the drain of the FET, and with the current discharge path extending between the first and second terminals.

15. The method of claim 14, wherein the current discharge path is coupled to a bias voltage, with the threshold being a function of the bias voltage.

16. The method of claim 15, further comprising coupling a current generator to the bias voltage, with the current generator being configured to operate on a signal on the first terminal.

17. The method of claim 16, wherein the current generator comprises a current mirror.

18. The method of claim 14, wherein the current discharge path further comprises an electronic switch in series with the diode.

19. The method of claim 18, further comprising coupling a pair of main electronic switches to the transistor, with the pair of main electronic switches alternatively switchable on and off for switching on and off the transistor, with the electronic switch in the current discharge path being coupled to one of the main electronic switches to be activated synchronously therewith.

20. A driver device for switching on and off a transistor feeding a load by driving a control electrode of the transistor, the driver device comprising:
- a first terminal coupled to the control electrode of the transistor;
- a second terminal coupled between the transistor and the load; and
- a current discharge path coupled to a bias voltage and to said first terminal and being activated when the transistor is switched off, said current discharge path comprising a diode to interrupt said current discharge path based on said second terminal having a voltage reaching a threshold, with the threshold being a function of the bias voltage.

21. The driver device of claim 20, further comprising a current generator coupled to the bias voltage, with said current generator being configured to operate on a signal on said first terminal.

22. The driver device of claim 21, wherein said current generator comprises a current mirror.

23. The driver device of claim 20, wherein said current discharge path further comprises an electronic switch in series with said diode.

24. The driver device of claim 23, further comprising a pair of main electronic switches alternatively switchable on and off for switching on and off the transistor, with said electronic switch in said current discharge path being coupled to one of said main electronic switches to be activated synchronously therewith.

25. The driver device of claim 20, wherein said first and second terminals and said current discharge path are configured on an integrated circuit.

26. A driver device for switching on and off a transistor feeding a load by driving a control electrode of the transistor, the driver device comprising:
- a first terminal coupled to the control electrode of the transistor;
- a second terminal coupled between the transistor and the load;
- a current discharge path coupled to said first terminal and being activated when the transistor is switched off, said current discharge path comprising an electronic switch and a diode in series with said electronic switch to interrupt said current discharge path based on said second terminal having a voltage reaching a threshold; and
- a pair of main electronic switches alternatively switchable on and off for switching on and off the transistor, with said electronic switch in said current discharge path being coupled to one of said main electronic switches to be activated synchronously therewith.

27. The driver device of claim 26, further comprising a current generator coupled to the bias voltage, with said current generator being configured to operate on a signal on said first terminal.

28. The driver device of claim 26, wherein said current generator comprises a current mirror.

* * * * *